United States Patent
Takeda (10) Patent No.: US 7,904,858 B2
(45) Date of Patent: Mar. 8, 2011

(54) LOGIC SYNTHESIS APPARATUS

(75) Inventor: Hideki Takeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 403 days.

(21) Appl. No.: 12/140,699

(22) Filed: Jun. 17, 2008

(65) Prior Publication Data

US 2009/0019417 A1    Jan. 15, 2009

(30) Foreign Application Priority Data

Jul. 12, 2007  (JP) .................... 2007-183187

(51) Int. Cl.
*G06F 17/50* (2006.01)
(52) U.S. Cl. ......... 716/104; 716/101; 716/106; 716/108; 716/113
(58) Field of Classification Search .................. 716/4, 5, 716/6, 18, 101, 104, 106, 108, 113, 136
See application file for complete search history.

(56) References Cited

U.S. PATENT DOCUMENTS

| | | | | |
|---|---|---|---|---|
| 5,903,475 A * | 5/1999 | Gupte et al. | ..................... | 703/16 |
| 6,263,483 B1 * | 7/2001 | Dupenloup | ..................... | 716/18 |
| 6,289,498 B1 * | 9/2001 | Dupenloup | ..................... | 716/18 |
| 6,295,636 B1 * | 9/2001 | Dupenloup | ..................... | 716/18 |
| 6,421,818 B1 * | 7/2002 | Dupenloup et al. | ............ | 716/18 |
| 2006/0123378 A1 * | 6/2006 | Cizl et al. | ......................... | 716/18 |

FOREIGN PATENT DOCUMENTS

JP        5-274390        10/1993

* cited by examiner

*Primary Examiner* — Sun J Lin
(74) *Attorney, Agent, or Firm* — Oblon, Spivak, McClelland, Maier & Neustadt, L.L.P.

(57) ABSTRACT

According to the present invention, there is provided an apparatus for executing logic synthesis for a module having a plurality of clock domains, having: an input unit which inputs circuit description data about a circuit function and a constraint in logic synthesis; a path selection unit which selects a path included in the module using a result obtained by analyzing the circuit description data; a recognition unit which recognizes a start point and an end point of the selected path and recognizes clock domains to which the start point and the end point belong; and a technology library setting unit which sets a technology library for the selected path in accordance with the clock domains to which the start point and the end point belong.

15 Claims, 9 Drawing Sheets

| SETTING | START POINT | END POINT | TECHNOLOGY LIBRARY |
|---|---|---|---|
| 1 | CLK1 | CLK1 | L1 |
| 2 | CLK2 | CLK2 | L1、L2 |
| 3 | CLK2 | CLK1 | L1、L2 |
| 4 | CLK1 | CLK2 | L1 |

| SETTING | START POINT | END POINT | TECHNOLOGY LIBRARY |
|---|---|---|---|
| 1 | CLK3 | CLK3 | L3 |
| 2 | CLK4 | CLK4 | L4 |
| 3 | CLK4 | CLK3 | L4 |
| 4 | CLK3 | CLK4 | L3 |

FIG. 8

| SETTING | CLOCK DOMAIN | TECHNOLOGY LIBRARY |
|---|---|---|
| 1 | CLK1 | L1 |
| 2 | CLK2 | L2 |

LOGIC SYNTHESIS APPARATUS

CROSS REFERENCE TO RELATED APPLICATION

This application is based upon and claims benefit of priority under 35 USC 119 from the Japanese Patent Application No. 2007-183187, filed on Jul. 12, 2007, the entire contents of which are incorporated herein by reference.

BACKGROUND OF THE INVENTION

The present invention relates to a logic synthesis apparatus and, more particularly, to a logic synthesis apparatus suitable for logic synthesis to select and set one of a plurality of technology libraries.

In logic synthesis of recent semiconductor integrated circuit design, an appropriate one of a plurality of technology libraries is selected and set in one LSI or one module as a target in order to obtain desired performance of the operation speed and power consumption.

As an application example of the plurality of technology libraries, technology libraries are individually prepared for a plurality of threshold voltages Vth and selectively used.

For example, for a part that requires a high-speed operation, logic synthesis and optimization are done by selecting and set a technology library having a cell using a low threshold voltage Vth. For a part where reduction of power consumption is necessary, a technology library having a cell using a high threshold voltage Vth is set. Alternatively, logic synthesis is performed by setting a plurality of technology libraries simultaneously, and each cell is selected using the optimization function of a logic synthesis tool.

Recent LSI products have complex specifications and a plurality of clocks and operation modes. The requirement also often changes according to the mode. Since both the high-speed operation and low power consumption are required of one product, optimization of selection of the threshold voltage Vth and selection of the technology library is necessary.

For example, when a plurality of clocks are used in a single module, a slow clock domain rarely becomes critical for the circuit operation. It is therefore preferable to arrange a cell having a high threshold voltage Vth in such a clock domain to reduce power consumption. Conventionally, however, there are the following problems in selecting technology libraries.

1) As a logic synthesis method using two technology libraries of different threshold voltages Vth, the technology libraries are selectively used for logic synthesis and logic optimization after that. As described above, it is possible to set a plurality of technology libraries simultaneously and select a cell using the optimization function of a logic synthesis tool. However, if the required specifications of the operation speed and power consumption are not satisfied, logic synthesis is done in the following two steps.

First, logic synthesis is done at once from the upper layer of the synthesis target using a technology library of high threshold voltage Vth. At this point of time, the speed constraint may not be satisfied yet. Second, logic optimization is done using the technology library of high threshold voltage Vth and that of low threshold voltage Vth. This replaces a cell of high threshold voltage Vth with a cell of low threshold voltage Vth in a path that does not satisfy the speed constraint, thereby ensuring a high operation speed.

Conventionally, however, technology library setting is uniformly executed for an entire module. For this reason, a cell using a low threshold voltage Vth may be allocated to even an unnecessary portion, resulting in an increase in power consumption.

2) When a module is divided in accordance with clock domains, some conventional methods enable to allocate a specific technology library to each clock domain by setting a technology library for each module. However, when one module includes a plurality of clock domains, it is impossible to set a technology library for each domain.

3) There is a method of executing bottom-up logic synthesis from the module of the lowermost layer. In this method, logic synthesis and optimization are performed by setting an appropriate technology library for only a module that requires a cell of low threshold voltage Vth. In the remaining modules, no technology library of low threshold voltage Vth is set. However, this method is time-consuming in overall logic synthesis and also incapable of executing sufficient optimization between the plurality of modules.

A reference that discloses a conventional logic synthesis technique will be described below.

Japanese Patent Laid-Open No. 05-274390

SUMMARY OF THE INVENTION

According to an aspect of the present invention, there is provided an apparatus for executing logic synthesis for a module having a plurality of clock domains, comprising an input unit which inputs circuit description data about a circuit function and a constraint in logic synthesis, a path selection unit which selects a path included in the module using a result obtained by analyzing the circuit description data, a recognition unit which recognizes a start point and an end point of the selected path and recognizes clock domains to which the start point and the end point belong, and a technology library setting unit which sets a technology library for the selected path in accordance with the clock domains to which the start point and the end point belong.

According to an aspect of the present invention, there is provided an apparatus for executing logic synthesis for a module having a plurality of clock domains, comprising an input unit which inputs circuit description data about a circuit function and a constraint in logic synthesis, a path selection unit which selects a path included in the module using a result obtained by analyzing the circuit description data, a recognition unit which recognizes a start point and an end point of the selected path and recognizes clock domains to which the start point and the end point belong, and a technology library setting unit which sets a technology library for the selected path in accordance with the clock domains to which the start point and the end point belong, wherein said technology library setting unit classifies paths included in the modules into A) a path from a first storage element which operates in synchronism with a clock to a second storage element which operates in synchronism with a clock, B) a path from an input terminal of the module to a storage element which operates in synchronism with a clock, C) a path from a storage element which operates in synchronism with a clock to an output terminal of the module, and D) a path from the input terminal of the module to the output terminal of the module, and sets the technology library for the selected path.

According to an aspect of the present invention, there is provided an apparatus for executing logic synthesis for a module having a plurality of clock domains, comprising, an input unit which inputs circuit description data about a circuit function and a constraint in logic synthesis, a path selection unit which selects a path included in the module using a result obtained by analyzing the circuit description data, a recognition unit which recognizes a start point and an end point of the selected path and recognizes clock domains to which the start point and the end point belong, and a technology library setting unit which sets a technology library for the selected path in accordance with the clock domains to which the start point and the end point belong, wherein when the start point and the end point belong to the same clock domain, said technology library setting unit sets, for the path, a technology library corresponding to the clock domain, when the start point and the end point belong to different clock domains, said technology library setting unit sets, for the start point, a technology library corresponding to the clock domain to which the start point belongs, sets, for the end point, a technology library corresponding to the clock domain to which the end point belongs, and sets, for a combinational circuit provided between the start point and the end point, one of the technology library set for the start point and the technology library set for the end point on the basis of preset priority orders.

DETAILED DESCRIPTION OF THE INVENTION

The embodiments of the present invention will now be described with reference to the accompanying drawings.

(1) First Embodiment

Figure 1:
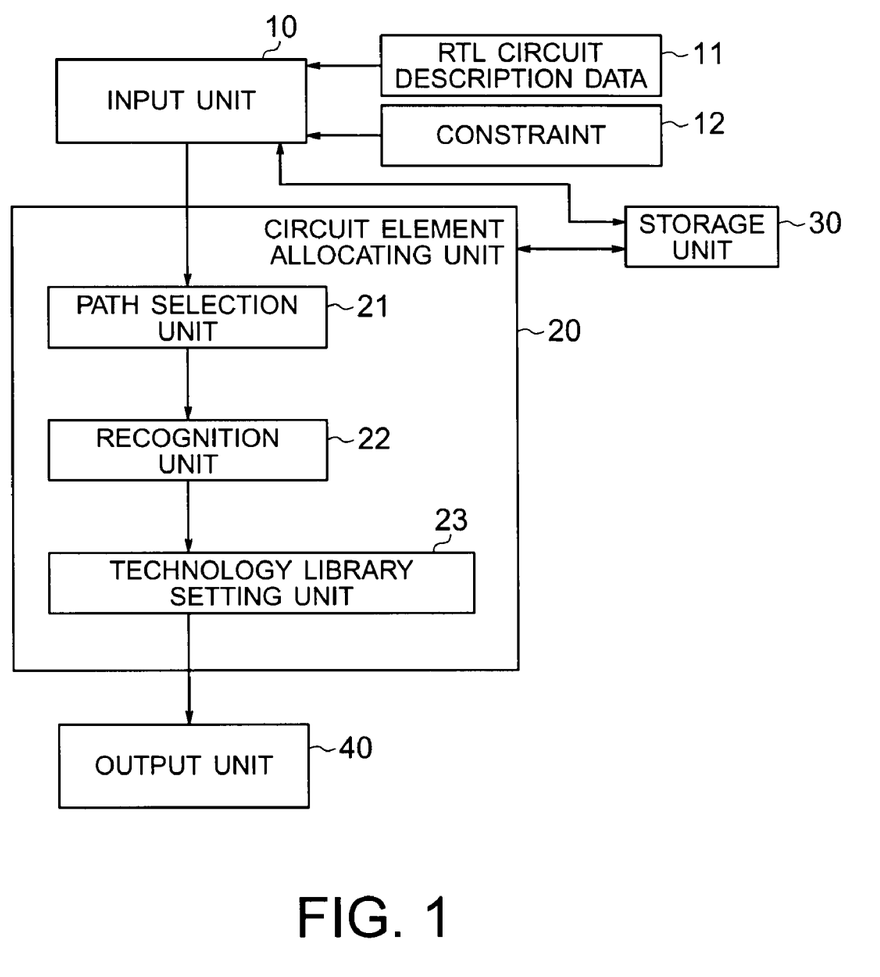
FIG. 1 is a block diagram showing the arrangement of a logic synthesis apparatus according to the first embodiment of the present invention.

FIG. 1 shows the arrangement of a logic synthesis apparatus according to the first embodiment.

The logic synthesis apparatus includes an input unit 10, circuit element allocating unit 20, storage unit 30, and output unit 40. The circuit element allocating unit 20 has a path selection unit 21, recognition unit 22, and technology library setting unit 23.

The input unit 10 receives RTL (Register Transfer Level) circuit description data 11 and a constraint 12. The storage unit 30 temporarily stores the input data.

In the circuit element allocating unit 20, the path selection unit 21 selects a path included in the circuit on the basis of the input RTL circuit description data 11.

The recognition unit 22 recognizes the start point and end point included in the selected path and also recognizes clock domains to which the two points belong.

The technology library setting unit 23 sets a technology library for the path and allocates a cell of the technology library.

The output unit 40 outputs the result from the circuit element allocating unit 20.

Figure 2:
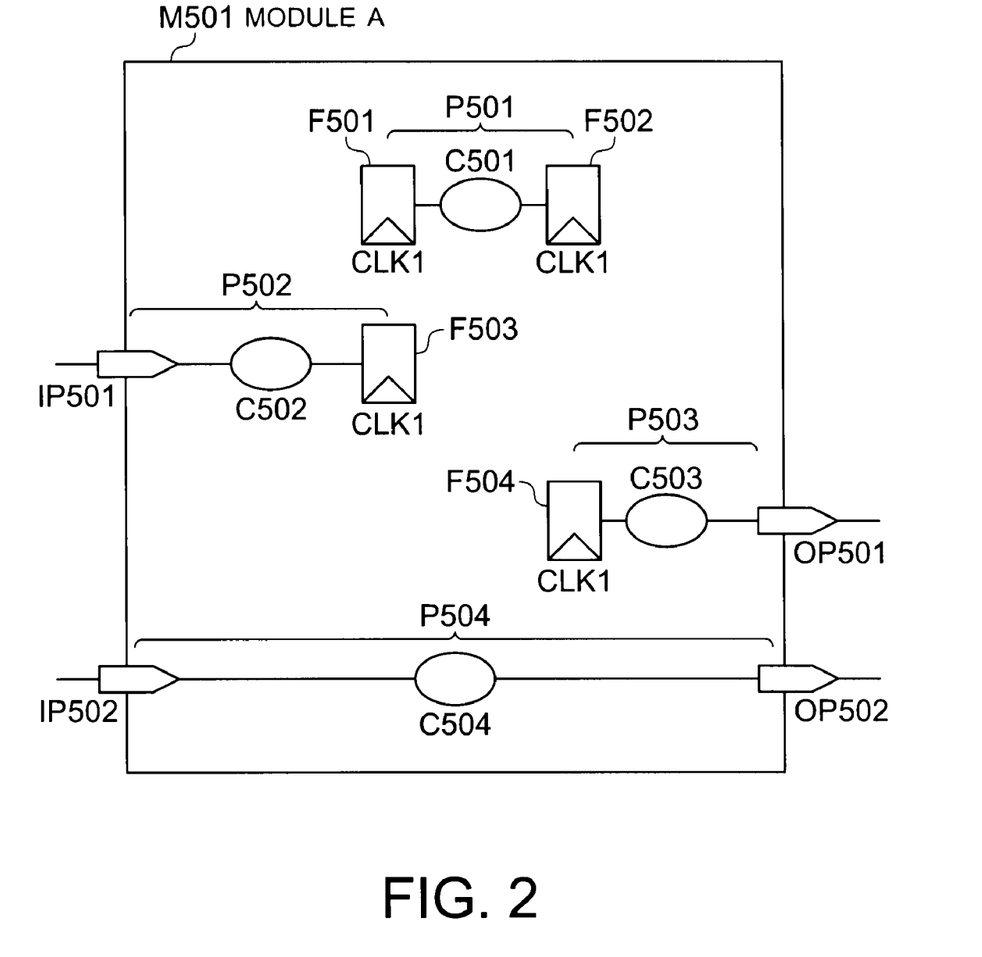
FIG. 2 is a block diagram showing four paths as basic segments to which technology libraries are applied in the first embodiment.

In the first embodiment, clock domains to which a start point and an end point belong are set for each path included in the module of the logic synthesis target. As shown in FIG. 2, the paths in a module A M501 are classified into A) a path P501 from a flip-flop F501 to a flip-flop F502, B) a path P502 from an input terminal IP501 to a flip-flop F503, C) a path P503 from a flip-flop F504 to an output terminal OP501, and D) a path P504 from an input terminal IP502 to an output terminal OP502.

Each of the flip-flops F501 to F504 serves as a storage element which operates in synchronism with a clock CLK1. Each flip-flop can be replaced with a memory, a latch, and the like. Combinational logic circuits C501, C502, C503, and C504 having no storage function are arranged between the flip-flops F501 and F502, between the input terminal IP501 and the flip-flop F503, between the flip-flop F504 and the output terminal OP501, and between the input terminal IP502 and the output terminal OP502, respectively.

Path extraction can easily be done using a path extraction engine incorporated in an existing logic synthesis tool, static timing analysis tool, timing driven layout tool, or the like.

In this embodiment, the paths are classified into the types A to D, and a technology library is selected for each path, as will be described below.

Figure 3:
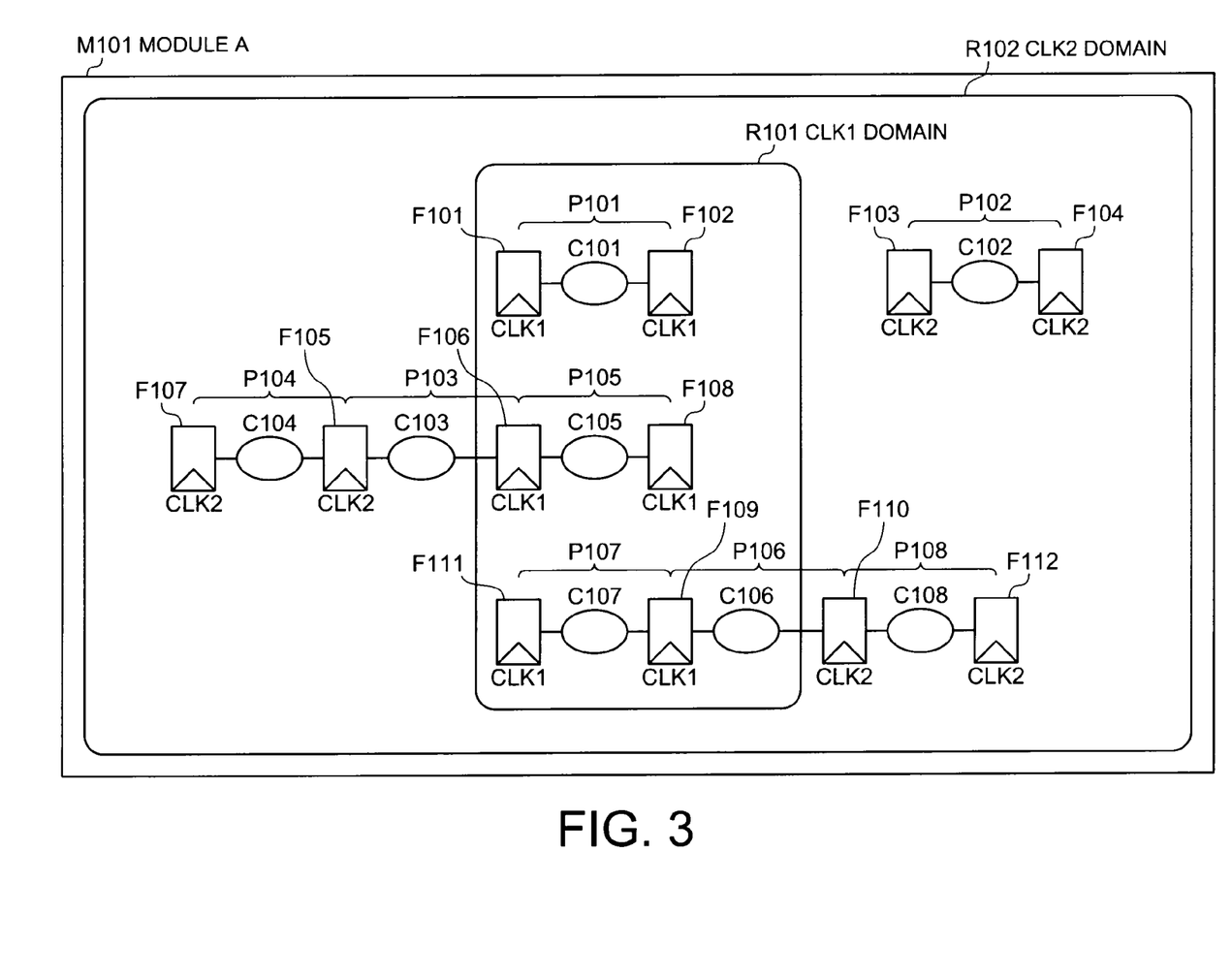
FIG. 3 is a block diagram showing the arrangement of a plurality of clock domains and paths included in a module of a logic synthesis target according to the first embodiment.

FIG. 3 shows paths in a module which is a logic synthesis target having two clock domains. A module A M101 has a clock domain R101 using the clock CLK1 and a clock domain R102 using the clock CLK2.

Figure 4:
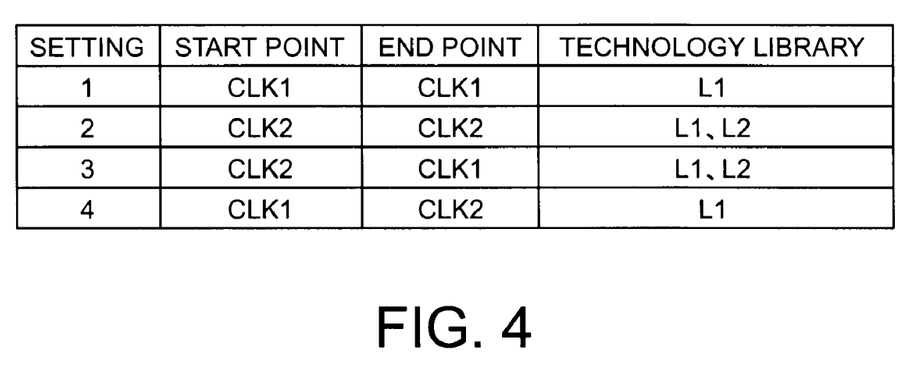
FIG. 4 is an explanatory view showing a setting example of technology libraries according to the first embodiment.

FIG. 4 shows a setting example of technology libraries applied to the module A M101.

The frequencies of the clocks CLK1 and CLK2 have a relationship CLK1<CLK2. For a path to which the clock CLK1 is applied, a technology library of high threshold voltage Vth is applied to make reduction of power consumption take priority over the operation speed. Conversely, for a path to which the clock CLK2 is applied, a technology library of low threshold voltage Vth is applied to make the operation speed take priority over reduction of power consumption.

In setting 1, when the start point uses the clock CLK1, and the end point uses the clock CLK1, a technology library L1 of high threshold voltage Vth is applied.

In setting 2, when the start point uses the clock CLK2, and the end point uses the clock CLK2, the technology library L1 of high threshold voltage Vth and a technology library L2 of low threshold voltage Vth are applied.

In setting 3, when the start point uses the clock CLK2, and the end point uses the clock CLK1, the technology library L1 of high threshold voltage Vth and the technology library L2 of low threshold voltage Vth are applied.

In setting 4, when the start point uses the clock CLK1, and the end point uses the clock CLK2, the technology library L1 of high threshold voltage Vth is applied.

In the arrangement shown in FIG. 3, the uppermost layer of the logic synthesis target corresponds to the module A M101. The clock domain R102 using the clock CLK2 is arranged all over the module A M101. The clock domain R101 using the clock CLK1 is arranged like an island at part of the clock domain R102.

In the clock domain R101, a path P101 uses the clock CLK1 at both the start point and end point, and setting 1 is applied accordingly. Hence, cells of the technology library L1 are allocated to a flip-flop F101 of the start point, a flip-flop F102 of the end point, and a combinational logic circuit C101 between them.

In the clock domain R102, a path P102 uses the clock CLK2 at both the start point and end point, and setting 2 is applied accordingly. Hence, cells of the technology libraries L1 and L2 are allocated to a flip-flop F103 of the start point, a flip-flop F104 of the end point, and a combinational logic circuit C102 between them.

The paths P101 and P102 are completely included in the clock domains R101 and R102, respectively. However, a path P103 is arranged across the clock domains R101 and R102. Since the start point uses the clock CLK2, and the end point uses the clock CLK1, setting 3 is applied. Hence, cells of the technology libraries L1 and L2 are allocated to a flip-flop F105, combinational logic circuit C103, and flip-flop F106.

A path P104 uses the clock CLK2 at both the start point and end point, and setting 2 is applied accordingly. Hence, cells of the technology libraries L1 and L2 are allocated to a flip-flop F107 of the start point, the flip-flop F105 of the end point, and a combinational logic circuit C104 between them.

The flip-flop F105 serves as both the start point of the path P103 and the end point of the path P104. Hence, both settings 2 and 3 are applicable to the flip-flop F105. In such a case, it is possible to uniquely decide a setting to be applied by giving priority orders to the settings.

Assume that priority orders of settings 1, 2, 3, and 4 lower in this order. In this case, setting 2 having higher priority is selected for the flip-flop F105, and a cell of the technology libraries L1 and L2 is allocated.

A path P105 uses the clock CLK1 at both the start point and end point, and setting 1 is applied accordingly. Hence, cells of the technology library L1 are allocated to the flip-flop F106 of the start point, a flip-flop F108 of the end point, and a combinational logic circuit C105 between them.

The flip-flop F106 serves as both the start point of the path P105 and the end point of the path P103.

When the priority orders are set, like the flip-flop F105, setting 1 is applied, and a cell of the technology library L1 is allocated.

A path P106 uses the clock CLK1 at the start point and the clock CLK2 at the end point, and setting 4 is applied accordingly. Hence, cells of the technology library L1 are allocated to a flip-flop F109, combinational logic circuit C106, and flip-flop F110.

The flip-flop F110 also serves as the start point of a path P108. The path P108 uses the clock CLK2 at both the start point and end point. Hence, setting 2 is applied, and the technology libraries L1 and L2 are allocated. In accordance with the above-described priority orders, setting 2 is applied to the flip-flop F110, and the technology libraries L1 and L2 are allocated.

The flip-flop F109 also serves as the end point of a path P107. The path P107 uses the clock CLK1 at both the start point and end point. Hence, setting 1 is applied, and the technology library L1 is allocated. In accordance with the above-described priority orders, setting 1 is applied to the flip-flop F109, and the technology library L1 is allocated. In this example, however, the technology library L1 is already applied to the flip-flop F109 in accordance with setting 4. Hence, the technology library does not change based on the priority orders.

Figure 5:
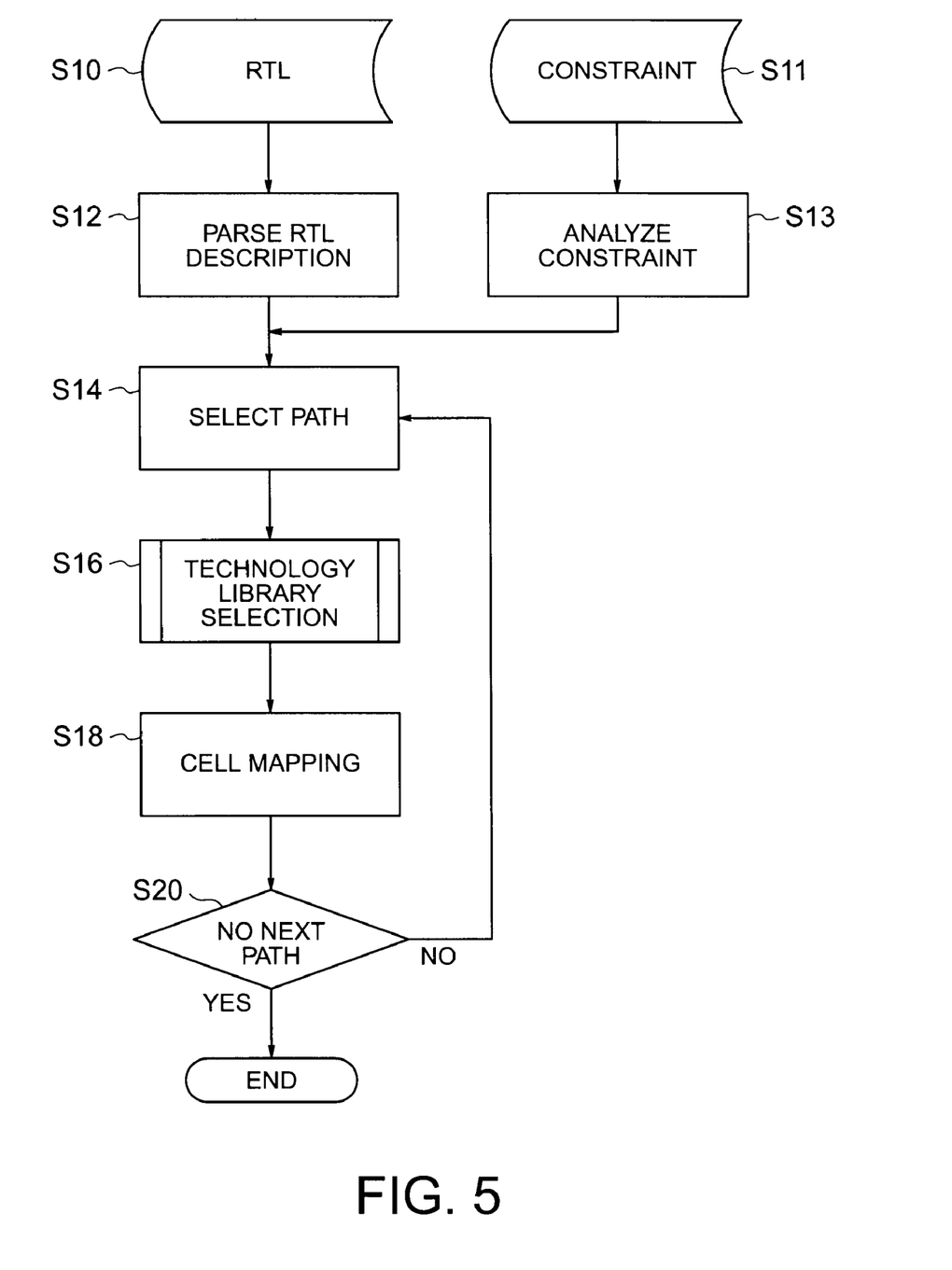
FIG. 5 is a flowchart illustrating a process procedure of logic synthesis according to the first embodiment.

The procedure of the logic synthesis and optimization process according to the first embodiment will be described with reference to the flowchart in FIG. 5. The process contents shown in FIG. 5 place focus on technology library selection and can also contain processes other than the described contents.

In step S10, circuit description data that describes a circuit function in an RTL description language is input to the input unit 10. In step S11, conditions about, e.g., the operation speed and power consumption are input to the input unit 10 as various constraints in the logic synthesis and optimization process. The storage unit 30 temporarily stores the input data.

In step S12, the path selection unit 21 parses the input RTL description data. In step S13, the path selection unit 21 analyzes the input constraints.

In step S14, the path selection unit 21 selects a path included in the circuit arrangement obtained by RTL description parsing.

In step S16, the recognition unit 22 recognizes the start point and end point of the selected path and the clock domains to which these points belong. The technology library setting unit 23 sets a technology library to be applied to the path.

In step S18, the technology library setting unit 23 allocates cells of the selected technology library to the constituent elements of the selected path. The process from step S14 to step S20 is repeated, thereby allocating cells to all paths.

Figure 6:
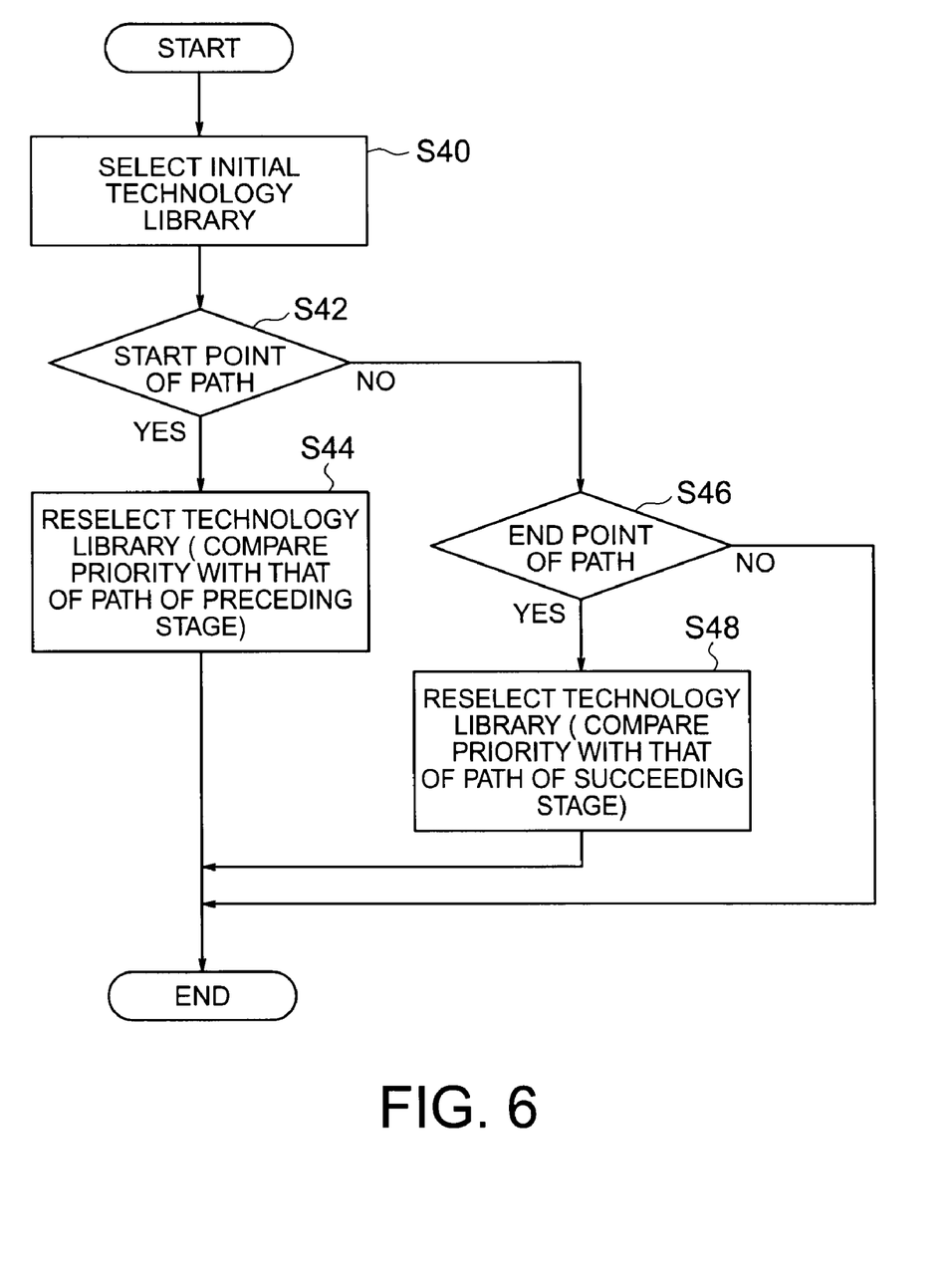
FIG. 6 is a flowchart illustrating a technology library selection process procedure in FIG. 5 according to the first embodiment.

The sequence of the technology library selection process in step S16 will be described with reference to the flowchart in FIG. 6.

In step S40, the recognition unit 22 recognizes the clock domain to which the start point belongs and the clock domain to which the end point belongs. The technology library setting unit 23 initially selects a technology library in accordance with the combination of the clock domain including the start point and the clock domain including the end point, and for example, the combination of the clocks CLK1 and CLK2 of the start point and end point as shown in FIG. 4 described above.

In step S42, the technology library setting unit 23 places focus on a constituent element of the path. In the above example, the technology library setting unit 23 places focus on, e.g., a flip-flop which stores data in synchronism with a clock and determines whether it is the start point or end point. If the flip-flop is the start point, the process advances to step S44.

In step S44, the technology library setting unit 23 compares, on the basis of preset priority orders, the technology library decided for the path of the preceding stage in which the constituent element of the start point serves as the end point with the technology library initially selected in step S40, and selects the technology library of higher priority order.

If the constituent element is not the start point of the path in step S42, the process advances to step S46.

In step S46, the technology library setting unit 23 determines whether the constituent element is the end point of a path. If the constituent element is the end point, the process advances to step S48 to compare, on the basis of the priority orders, the technology library decided for the path of the succeeding stage in which the constituent element serves as the start point with the initially selected technology library, and reselect the technology library.

Upon determining in step S46 that the constituent element is a combinational circuit located at the intermediate point which is neither the start point nor the end point, the technology library setting unit 23 finally sets the initially selected technology library.

According to the first embodiment, in logic synthesis of a module having a plurality of clock domains, optimum technology libraries are individually set for the respective clock domains in the module in accordance with the requirements such as a high operation speed and reduction of power consumption. This improves the quality of logic synthesis.

More specifically, a technology library having cells of high threshold voltage Vth is set for a clock domain where an operation at low power consumption is necessary. Only a technology library having cells of low threshold voltage Vth is set for a clock domain where a high-speed operation is required, thereby implementing optimization.

(2) Second Embodiment

A logic synthesis apparatus according to the second embodiment of the present invention will be described.

In the first embodiment, one module exists in all. In the second embodiment, a module includes another module.

Figure 7:
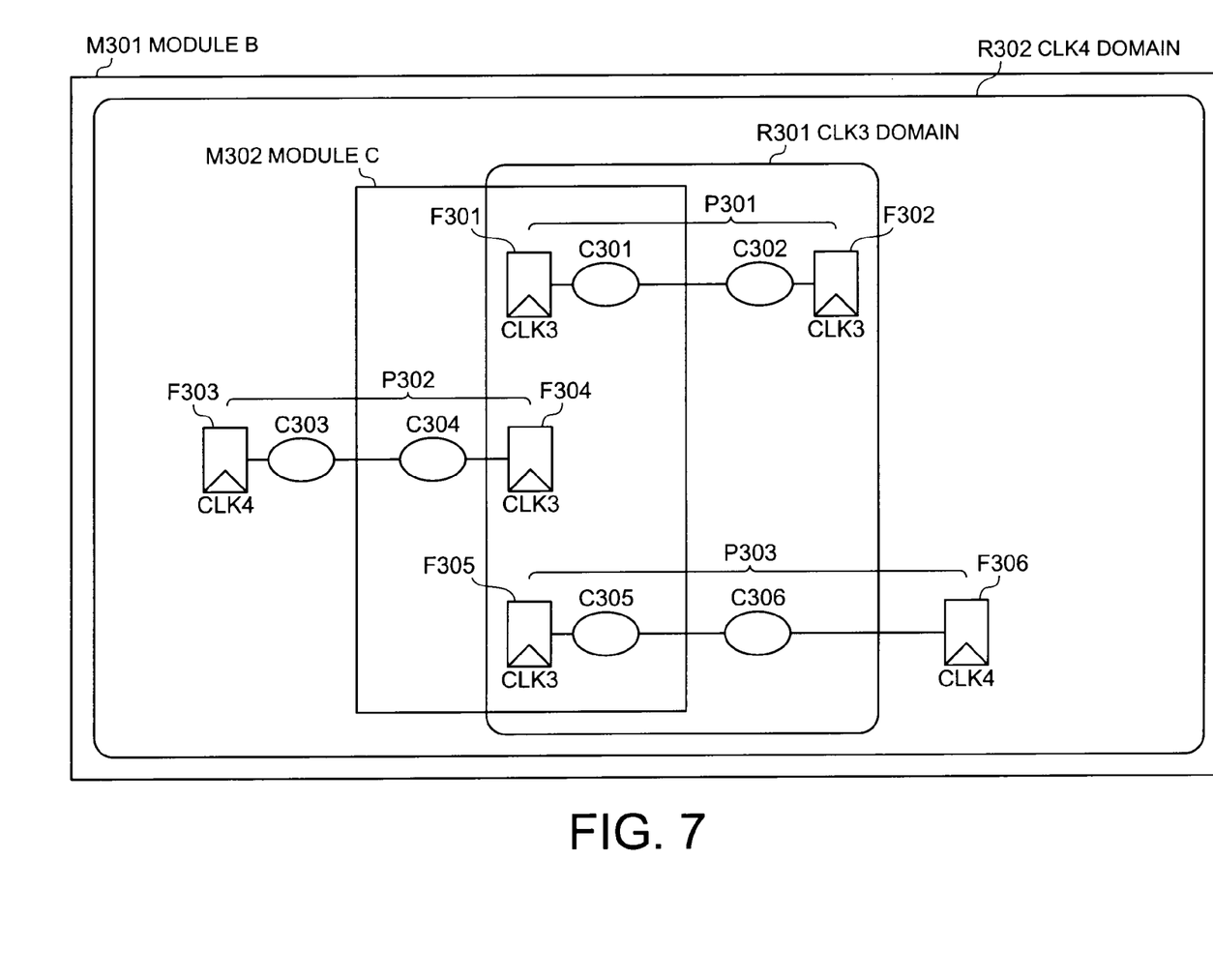
FIG. 7 is a block diagram showing the arrangement of a plurality of clock domains, a plurality of modules, and paths included in a module of a logic synthesis target according to the second embodiment of the present invention.

FIG. 7 shows the arrangement of a module B M301 that is a logic synthesis target. The entire module B M301 corresponds to a clock domain R302 which operates in synchronism with a clock CLK4. A clock domain R301 which operates in synchronism with a clock CLK3 is arranged like an island in the clock domain R302. A module C M302 is arranged across the clock domains R301 and R302.

That is, the module B M301 has a hierarchical structure. The module C M302 is arranged in the module B M301 and includes the two clock domains R301 and R302.

Figure 8:
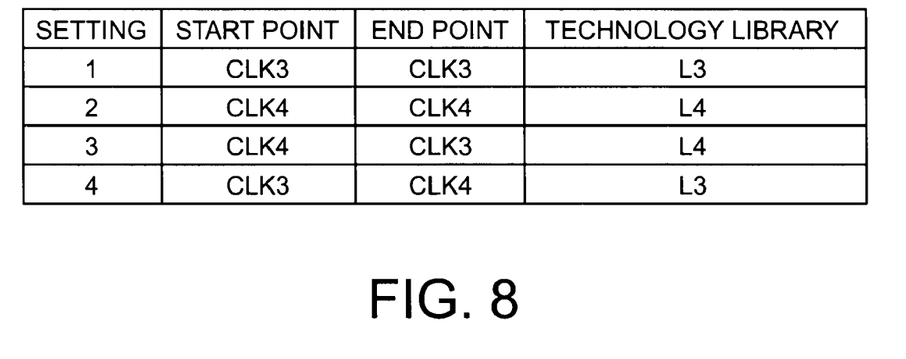
FIG. 8 is an explanatory view showing a setting example of technology libraries according to the second embodiment.

FIG. 8 shows a setting example of technology libraries applied to the module B M301.

The frequencies of the clocks CLK3 and CLK4 have a relationship CLK3<CLK4. For a path to which the clock CLK3 is applied, a technology library of high threshold voltage Vth is applied to make reduction of power consumption take priority. Conversely, for a path to which the clock CLK4 is applied, a technology library of low threshold voltage Vth is applied to make the operation speed take priority.

In setting 1, when the start point uses the clock CLK3, and the end point uses the clock CLK3, a technology library L3 of high threshold voltage Vth is applied.

In setting 2, when the start point uses the clock CLK4, and the end point uses the clock CLK4, a technology library L4 of low threshold voltage Vth is applied.

In setting 3, when the start point uses the clock CLK4, and the end point uses the clock CLK3, the technology library L4 of low threshold voltage Vth is applied.

In setting 4, when the start point uses the clock CLK3, and the end point uses the clock CLK4, the technology library L3 of high threshold voltage Vth is applied.

Referring to FIG. 7, in a path P301 arranged across the module C M302 and the module B M301, both the start point and end point belong to the clock domain R301, and setting 1 is applied accordingly. Hence, cells of the technology library L3 are allocated to a flip-flop F301 of the start point, a flip-flop F302 of the end point, and combinational logic circuits C301 and C302 between them.

A path P302 is arranged across the module C M302 and the module B M301 and also across the clock domains R302 and R301. Since a flip-flop F303 of the start point belongs to the clock domain R302, and a flip-flop F304 of the end point belongs to the clock domain R301, setting 3 is applied. Hence, cells of the technology library L4 are allocated to the flip-flops F303 and F304, and combinational logic circuits C303 and C304 between them.

If the path of the preceding stage (not shown) of the path P302 is closed in the clock domain R302, the flip-flop F303 serving as the start point of the path P302 also serves as the end point of the preceding path, and setting 2 is applied to the path. Hence, both settings 2 and 3 are applicable to the flip-flop F303.

This problem can be solved by giving priority orders to the setting conditions, as in the first embodiment. Assume that priority orders of settings 1, 2, 3, and 4 lower in this order. In this case, setting 2 is selected, and a cell of the technology library L4 is allocated.

If the path of the succeeding stage, in which the flip-flop F304 serving as the end point of the path P302 serves as the start point, is closed in the clock domain R301, setting 1 is applied to the path. As a result, settings 1 and 3 are applicable to the flip-flop F304.

In this case, setting 1 is applied in consideration of the priority orders, like the flip-flop F303, and a cell of the technology library L3 is allocated.

In a path P303, a flip-flop F305 of the start point belongs to the clock domain R301, and a flip-flop F306 of the end point belongs to the clock domain R302. Hence, setting 3 is applied. Cells of the technology library L3 are allocated to the flip-flops F305 and F306, and combinational logic circuits C305 and C306 between them.

As described above regarding the path P302, if the path of the preceding stage (not shown) of the flip-flop F305 is closed in the clock domain R301, setting 1 is applied to the constituent elements of the path. Considering the priority orders, setting 1 is applied to the flip-flop F305.

If the path of the succeeding stage (not shown) of the flip-flop F306 is closed in the clock domain R302, setting 2 is applied to the constituent elements of the path. According to the priority orders, setting 2 is applied to the flip-flop F306.

Consequently, setting 1 is applied to the flip-flop F305, and a cell of the technology library L3 is allocated to it. Setting 2 is applied to the flip-flop F306, and a cell of the technology library L4 is allocated to it. Setting 4 is applied to the combinational logic circuits C305 and C306, and cells of the technology library L3 are allocated to them.

The procedure of the logic synthesis and optimization process is the same as in the above-described first embodiment, and a description thereof will not be repeated.

According to the second embodiment, it is possible to easily set and optimize the technology libraries in accordance with the clocks input to the flip-flops of the start point and end point of each path regardless of the existence of the plurality of modules.

(3) Third Embodiment

The third embodiment of the present invention will be described with reference to the accompanying drawings. The module of the logic synthesis target of the third embodiment is the same as that shown in FIG. 3 referred in the first embodiment.

Figure 9:
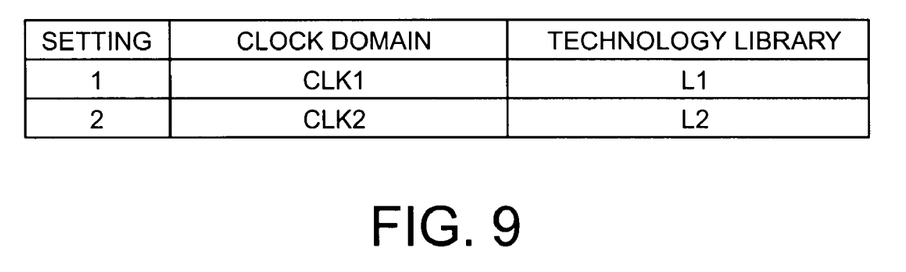
FIG. 9 is an explanatory view showing a setting example of technology libraries according to the third embodiment of the present invention.

FIG. 9 shows a setting example of technology libraries according to a module A M101. In the first embodiment, technology libraries are set in accordance with clocks input to a flip-flop serving as a start point and that serving as an end point. In the third embodiment, however, a technology library is set for each clock domain, unlike the first embodiment.

The frequencies of clocks CLK1 and CLK2 have a relationship CLK1<CLK2. A technology library L1 has cells which use a high threshold voltage Vth and has a relatively low operation speed and low power consumption. A technology library L2 has cells which use a low threshold voltage Vth and has a relatively high operation speed and high power consumption.

In setting 1, the technology library L1 is applied to a clock domain R101 where the clock CLK1 is used.

In setting 2, the technology library L2 is applied to a clock domain R102 where the clock CLK2 is used.

Of the paths shown in FIG. 3, a path P101 has flip-flops F101 and F102, which serve as the start point and end point and belong to the clock domain R101 where the clock CLK1 is used. In this case, setting 1 is applied, and cells of the technology library L1 are allocated to the flip-flops F101 and F102 and a combinational logic circuit C101 between them.

A path P102 has flip-flops F103 and F104, which serve as the start point and end point and belong to the clock domain R102 where the clock CLK2 is used. In this case, setting 2 is applied, and cells of the technology library L2 are allocated to the flip-flops F103 and F104 and a combinational logic circuit C102 between them.

Similarly, setting 2 is applied to a path P104, and setting 1 is applied to a path P105. Cells of the technology libraries L2 are allocated to the flip-flops of the start points and end points and the combinational logic circuits between them included in the path P104, and cells of the technology libraries L1 are allocated to the flip-flops of the start points and end points and the combinational logic circuits between them included in the path P105, respectively.

On the other hand, a path P103 is arranged across the clock domains R102 and R101. In this case, for a combinational logic circuit C103 located at the intermediate point between the start point and end point, for example, 1) one of setting 2 applied to the start point and setting 1 applied to the end point, which has a higher one of preset priority orders, is applied, or 2) setting 2 applied to the start point is applied, or setting 1 applied to the end point is applied.

The procedure of the logic synthesis and optimization process in this case will be described. The overall process procedure is the same as the contents described in the first embodiment with reference to FIG. 5.

Figure 10:
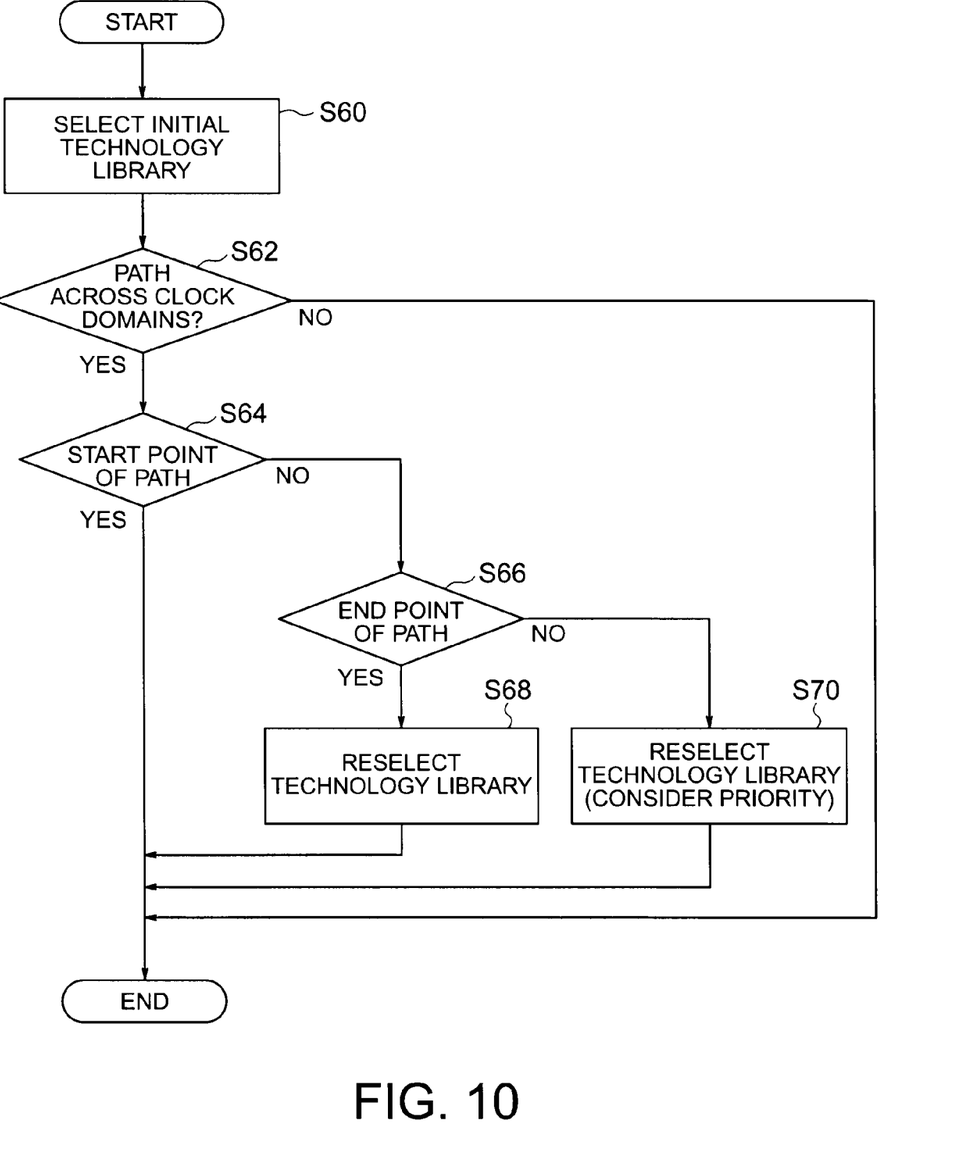
FIG. 10 is a flowchart illustrating a technology library selection process procedure in FIG. 5 in logic synthesis according to the third embodiment.

The third embodiment is different from the first embodiment in the technology library setting in step S16. FIG. 10 shows this process. In this example, the technology library is set in accordance with 2). The process contents shown in FIGS. 5 and 10 place focus on technology library selection and can also contain other processes.

In step S60, a recognition unit 22 recognizes the clock domain to which the start point belongs. A technology library setting unit 23 initially selects a technology library for the clock domain in accordance with the setting example shown in FIG. 9.

In step S62, the technology library setting unit 23 determines whether the path recognized by the recognition unit 22 belongs to a plurality of clock domains and, more specifically, whether the start point and end point belong to different clock domains.

If the path is not arranged across a plurality of clock domains, the start point and end point belong to the same clock domain. Hence, the initially selected technology library is set finally. In this case, cells of the initially selected technology library are allocated to all constituent elements of the path. If the path is arranged across a plurality of clock domains, the process advances to step S64.

The technology library setting unit 23 places focus on a specific constituent element of the path and determines whether it is the start point. If it is the start point, the initially selected technology library is finally set for the start point.

If the constituent element is not the start point, the process advances to step S66 to determine whether the constituent element is the end point.

If the constituent element is the end point, the process advances to step S68. The technology library setting unit 23 changes the technology library initially set for the start point and reselects a technology library corresponding to the clock domain to which the constituent element serving as the end point belongs.

If the constituent element is not the end point but a combinational circuit located between the start point and end point, the process advances to step S70. The technology library setting unit 23 compares the technology library initially selected for the start point with the technology library reselected for the end point and reselects the technology library. In this case, for example, priority orders are set in advance, and a technology library having a higher priority is selected.

Alternatively, in step S70, the same predetermined technology library as that of the start point or end point may be set for the combinational circuit located between them, like 2).

According to the third embodiment, a technology library is set for each clock domain. In logic synthesis of a module having a plurality of clock domains, optimum technology libraries are individually set for the respective clock domains in accordance with the requirements such as a high operation speed and reduction of power consumption. This improves the quality of logic synthesis.

According to the logic synthesis apparatuses of the first to third embodiments, even when one module includes a plurality of clock domains, or one module includes another module, it is possible to optimize technology library selection.

The above-described embodiments are merely examples and do not limit the present invention. Various changes and modifications can be made without departing from the technical scope of the present invention.

What is claimed is:

1. An apparatus for executing a logic synthesis for a module having a plurality of clock domains, comprising:
   an input unit configured to input circuit description data about a circuit function and a constraint in the logic synthesis;
   a path selection unit configured to select a path included in the module using a result obtained by analyzing the circuit description data;
   a recognition unit configured to recognize a start point and an end point of the selected path and to recognize clock domains to which the start point and the end point belong; and
   a technology library setting unit configured to set a technology library for the selected path in accordance with the clock domains to which the start point and the end point belong.

2. The apparatus according to claim 1, wherein said technology library setting unit is configured to
   initially set the technology library in accordance with the clock domains to which the start point and the end point belong,
   set, for the start point on the basis of preset priority orders, one of a technology library which is set for a path of a preceding stage having the start point as an end point and the technology library initially set for the start point, and set, for the end point on the basis of the preset priority orders, one of a technology library which is set for a path of a succeeding stage having the end point as a start point and the technology library initially set for the end point.

3. The apparatus according to claim 2, wherein said technology library setting unit is configured to set the initially set technology library for a combinational circuit between the start point and the end point.

4. The apparatus according to claim 1, wherein said technology library setting unit is configured to set the technology library for a combinational circuit between the start point and the end point.

5. The apparatus according to claim 1, wherein the constraint includes conditions about an operation speed and a power consumption in the logic synthesis.

6. The apparatus according to claim 1, wherein in recognizing the start point and the end point in the selected path, said recognition unit is configured to recognize one of an input terminal of the module and a storage element synchronized with a clock as the start point of the selected path, and one of an output terminal of the module and a storage element synchronized with a clock as the end point of the selected path.

7. The apparatus according to claim 1, wherein
the technology library includes a first technology library having a first threshold voltage, and a second technology library having a second threshold voltage lower than the first threshold voltage,
the clock domain includes a first clock domain which operates upon receiving a first clock having a first frequency, and a second clock domain to which a second clock having a second frequency higher than the first frequency is supplied, and
said technology library setting unit is configured to set the first technology library when the start point and the end point of the selected path belong to the first clock domain, to set the second technology library when the start point and the end point of the selected path belong to the second clock domain, and to set a preset one of the first and second technology libraries when the start point and the end point of the selected path belong to different clock domains.

8. An apparatus for executing a logic synthesis for a module having a plurality of clock domains, comprising:
an input unit configured to input circuit description data about a circuit function and a constraint in the logic synthesis;
a path selection unit configured to select a path included in the module using a result obtained by analyzing the circuit description data;
a recognition unit configured to recognize a start point and an end point of the selected path and to recognize clock domains to which the start point and the end point belong; and
a technology library setting unit configured to set a technology library for the selected path in accordance with the clock domains to which the start point and the end point belong,
wherein said technology library setting unit is configured to classify paths included in the modules into
A) a path from a first storage element which operates in synchronism with a clock to a second storage element which operates in synchronism with a clock,
B) a path from an input terminal of the module to a storage element which operates in synchronism with a clock,
C) a path from a storage element which operates in synchronism with a clock to an output terminal of the module, and
D) a path from the input terminal of the module to the output terminal of the module, and
is configured to set the technology library for the selected path.

9. The apparatus according to claim 8, wherein
the storage element, the first storage element, and the second storage element, each of which is configured to operate in synchronism with a clock, include one of a flip flop, a memory, and a latch, and
the path includes a combinational logic circuit having no storage function.

10. An apparatus for executing a logic synthesis for a module having a plurality of clock domains, comprising:
an input unit configured to input circuit description data about a circuit function and a constraint in the logic synthesis;
a path selection unit configured to select a path included in the module using a result obtained by analyzing the circuit description data;
a recognition unit configured to recognize a start point and an end point of the selected path and to recognize clock domains to which the start point and the end point belong; and
a technology library setting unit configured to set a technology library for the selected path in accordance with the clock domains to which the start point and the end point belong,
wherein when the start point and the end point belong to the same clock domain, said technology library setting unit is configured to set, for the selected path, a technology library corresponding to said same clock domain,
when the start point and the end point belong to different clock domains, said technology library setting unit is configured to set, for the start point, one technology library corresponding to one clock domain to which the start point belongs, to set, for the end point, another technology library corresponding to another clock domain to which the end point belongs, and to set, for a combinational circuit provided between the start point and the end point, one of the technology library set for the start point and the technology library set for the end point on the basis of preset priority orders.

11. The apparatus according to claim 10, wherein the constraint includes conditions about an operation speed and a power consumption in the logic synthesis.

12. The apparatus according to claim 10, wherein in recognizing the start point and the end point in the selected path, said recognition unit is configured to recognize one of an input terminal of the module and a storage element synchronized with a clock as the start point of the selected path, and one of an output terminal of the module and a storage element synchronized with a clock as the end point of the selected path.

13. The apparatus according to claim 10, wherein said technology library setting unit is configured to classify paths included in the modules into
A) a path from a first storage element which operates in synchronism with a clock to a second storage element which operates in synchronism with a clock,
B) a path from an input terminal of the module to a storage element which operates in synchronism with a clock,
C) a path from a storage element which operates in synchronism with a clock to an output terminal of the module, and D) a path from the input terminal of the module to the output terminal of the module, and is configured to set the technology library for the selected path.

14. The apparatus according to claim 13, wherein
the storage element, the first storage element, and the second storage element, each of which is configured to operate in synchronism with a clock, include one of a flip flop, a memory, and a latch, and the path includes a combinational logic circuit having no storage function.

15. The apparatus according to claim 10, wherein
the technology library includes a first technology library having a first threshold voltage, and a second technology library having a second threshold voltage lower than the first threshold voltage, the clock domain includes a first clock domain which operates upon receiving a first clock having a first frequency, and a second clock domain to which a second clock having a second frequency higher than the first frequency is supplied, and said technology library setting unit is configured to set the first technology library when the start point and the end point of the selected path belong to the first clock domain, to set the second technology library when the start point and the end point of the selected path belong to the second clock domain, and to set a preset one of the first and second technology libraries when the start point and the end point of the selected path belong to different clock domains.

* * * * *